United States Patent [19]
Echigo et al.

[11] Patent Number: 5,483,106
[45] Date of Patent: Jan. 9, 1996

[54] SEMICONDUCTOR DEVICE FOR SENSING STRAIN ON A SUBSTRATE

[75] Inventors: Masashi Echigo, Kariya; Yoshitaka Nagayama, Nukata; Takushi Maeda, Obu; Toshitaka Yamada, Okazaki; Masahiko Kitano, Nukata, all of Japan

[73] Assignee: Nippondenso Co., Ltd., Kariya, Japan

[21] Appl. No.: 282,006

[22] Filed: Jul. 29, 1994

[30] Foreign Application Priority Data

Jul. 30, 1993 [JP] Japan ............... 5-189711

[51] Int. Cl.$^6$ ............... H01L 23/48; H01L 23/29; H01L 23/50
[52] U.S. Cl. ............... 257/783; 257/782; 257/792; 257/795
[58] Field of Search ............... 257/782, 783, 257/792, 795

[56] References Cited

U.S. PATENT DOCUMENTS

| | | | |
|---|---|---|---|
| 4,732,702 | 3/1988 | Yamazaki et al. | 252/512 |
| 4,888,634 | 12/1989 | Lai et al. | 257/783 |
| 4,963,002 | 10/1990 | Tagusa et al. | 359/88 |
| 5,001,542 | 3/1991 | Tsukagoshi et al. | 257/783 |
| 5,113,241 | 5/1992 | Yanagida et al. | 257/783 |
| 5,150,616 | 9/1992 | Kondo et al. | 73/517 R |
| 5,371,404 | 12/1994 | Juskey et al. | 257/795 |

FOREIGN PATENT DOCUMENTS

| | | |
|---|---|---|
| 60-94744 | 5/1985 | Japan . |
| 60-136231 | 7/1985 | Japan . |
| 60-154403 | 8/1985 | Japan . |
| 1113601 | 5/1989 | Japan . |
| 2173073 | 7/1990 | Japan . |
| 357645 | 6/1991 | Japan . |
| 3120059 | 12/1991 | Japan . |
| 4274005 | 9/1992 | Japan . |
| 5302937 | 11/1993 | Japan . |

OTHER PUBLICATIONS

Journal of Nippondenso Technical Disclosure 75–107, 1990.

*Primary Examiner*—Mahshid Saadat
*Attorney, Agent, or Firm*—Cushman, Darby & Cushman

[57] ABSTRACT

In fixing a sensor element for sensing stress on a substrate by using an adhesive for semiconductors, the present invention aims to solve both the problems of stress applied from the substrate side due to temperature change and defects in wire bonding in the wire bonding process. In a semiconductor device equipped with a sensor element for sensing stress fixed on a substrate, an adhesive for semiconductors is used which is prepared by compounding resin beads made of resin with a base adhesive made of flexible resin.

9 Claims, 5 Drawing Sheets

SEMICONDUCTOR DEVICE FOR SENSING STRAIN ON A SUBSTRATE

BACKGROUND OF THE INVENTION

1. Field of the Invention

The present invention generally relates to a semiconductor device which uses an adhesive for fixing a sensor element for sensing strain on a substrate.

2. Description of the Related Arts

As an adhesive for semiconductors similar to the present invention, an adhesive which is generally used for fixing IC chips, LSI pellets, electronic parts, etc. on insulating substrates or electrodes has been disclosed in the Japanese Unexamined Patent Publication No. 60-154403 and the U.S. Pat. No. 4,732,702.

The above adhesive comprises a base adhesive and beads compounded therewith, and silica powder and/or glass are used as beads.

In addition to the above electronic parts, it is proposed in the U.S. Pat. No. 5,150,616 and other patent publications that an adhesive with which the above beads are compounded should be used for a semiconductor device equipped with a sensor element for sensing strain.

However, when an adhesive for semiconductors with which the above beads were compounded was used for a semiconductor device equipped with a sensor element for sensing strain, a new problem was caused that there was significant fluctuation in the output voltage (characteristic fluctuation).

SUMMARY OF THE INVENTION

It is an object of the present invention to provide a semiconductor device which can reduce the characteristic fluctuation of a sensor element included in the semiconductor device even when the sensor element is fixed on a substrate.

The inventors of the present invention made various studies to find the cause of the above characteristic fluctuation. As a result, it was found that the stress applied from the substrate side considerably acted on the sensor element through silica powder and/or glass used as beads due to the environmental variation or the fluctuation in the temperature during the actual operation of the semiconductor devices.

Then, the inventors of the present invention made further studies by using an adhesive with which the above beads were not compounded for a semiconductor device equipped with a sensor element for sensing strain. As a result, the characteristic fluctuation could be controlled, but on the other hand, there were defects in wire bonding caused by the insufficient transmission of ultrasonic vibration from a bonding tool during the wire bonding process.

From the above results, both the stress from the substrate side and the defects in wire bonding should be solved simultaneously.

On the other hand, in order to mitigate the stress between the substrate and the sensor element, the inventors of the present invention inserted a silicone or molybdenum pedestal into between the substrate and the sensor element. As a result, the characteristic fluctuation could sufficiently be restrained, and a high wire bondability could be obtained. However, though this method serves for mitigating the stress and reducing defects in wire bonding, the addition of the pedestal makes it very difficult to downsize the semiconductor devices, which is demanded by the current market, and substantially increases the cost of semiconductor production.

For the above reason, it is demanded to reduce the characteristic fluctuation of a sensor element for sensing strain and to prevent defects in wire bonding without using any pedestal.

Therefore, according to the present invention, a semiconductor device equipped with a sensor element for sensing strain fixed on the substrate is characterized by an arrangement that the above sensor element is fixed on the substrate by using an adhesive for semiconductors which comprises a base adhesive made of flexible resin with which beads made of resin are composed.

According to the present invention, as the adhesive for semiconductors, flexible resin is used for the base adhesive and resin is used for the beads to be compounded with the base adhesive. Therefore, as the stress applied from the substrate side is mitigated by the adhesive for semiconductors, the stress applied on the sensor element can be mitigated.

BRIEF DESCRIPTION OF THE DRAWINGS

These and other objects and advantages of this invention will become more apparent and more readily appreciated from the following detailed description of the presently preferred exemplary embodiments of the invention taken in conjunction with the accompanying drawings, of which.

DETAILED DESCRIPTION OF THE EMBODIMENTS

Figure 1A:
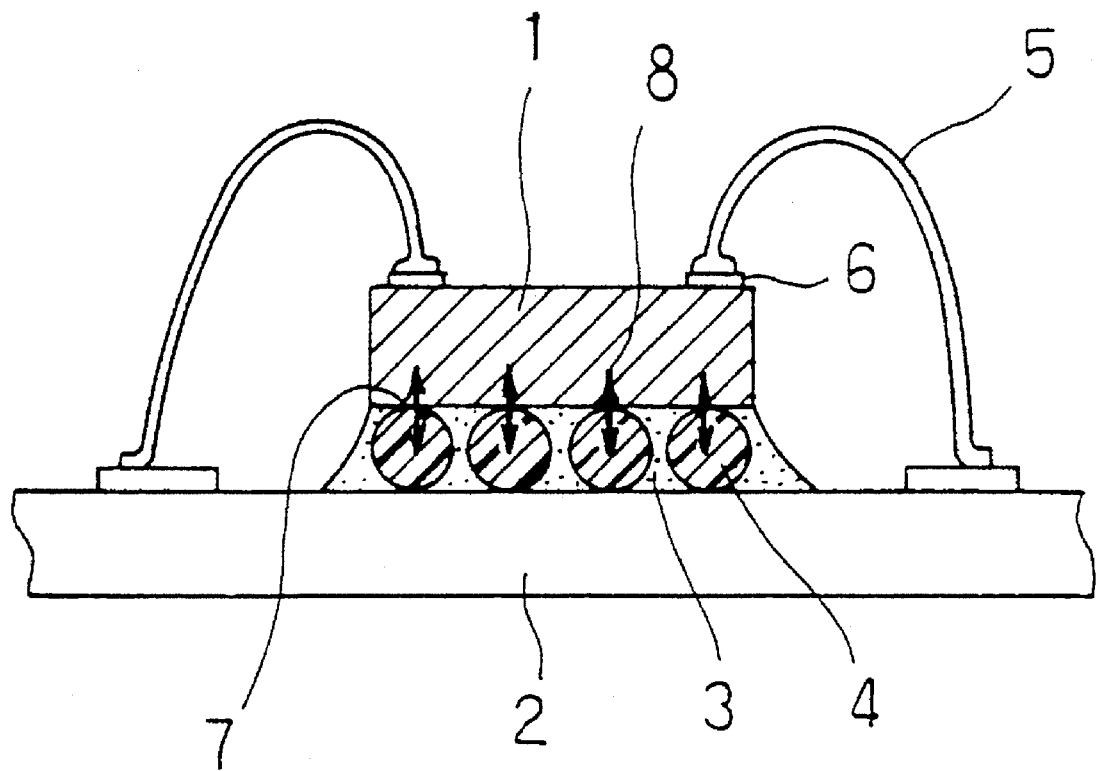
FIG. 1A and FIG. 1B are cross-sectional views illustrating the applied condition according to the present invention.

FIG. 1A is a cross-sectional view of an embodiment according to the present invention, illustrating the applied condition thereof.

A semiconductor element (sensor element) 1 is one of the components of an acceleration sensor for sensing pressure and outputting signals accordingly, on which acceleration is detected by an electric circuit (not illustrated).

A semiconductor device composed as illustrated in FIG. 1A is manufactured by using the following procedure. First, resin beads 4 are compounded with a base adhesive 3 to prepare an adhesive for semiconductors (The base adhesive 3 and resin beads 4 will be detailed herein later). Secondly, the adhesive for semiconductors is applied to an alumina substrate or a lead frame 2 (substrate), and the sensor element 1 for sensing strain is disposed thereon. Thirdly, a load is applied to the sensor element 1 to such an extent that the resin beads 4 will not be deformed or fractured to level the above adhesive for semiconductors and set the adhesive film thickness to be larger than the particle size of the resin beads 4. Fourthly, the adhesive for semiconductors is cured at the preset temperature with the above adhesive film thickness maintained to complete die bonding of the sensor element 1 on the substrate 2. Fifthly, when required, as illustrated in FIG. 1A, bonding wires 5 are fixed on the die-bonded sensor element 1 through respective bonding pads 6 by the ultrasonic bonding method or alternative thereto.

Figure 1B:
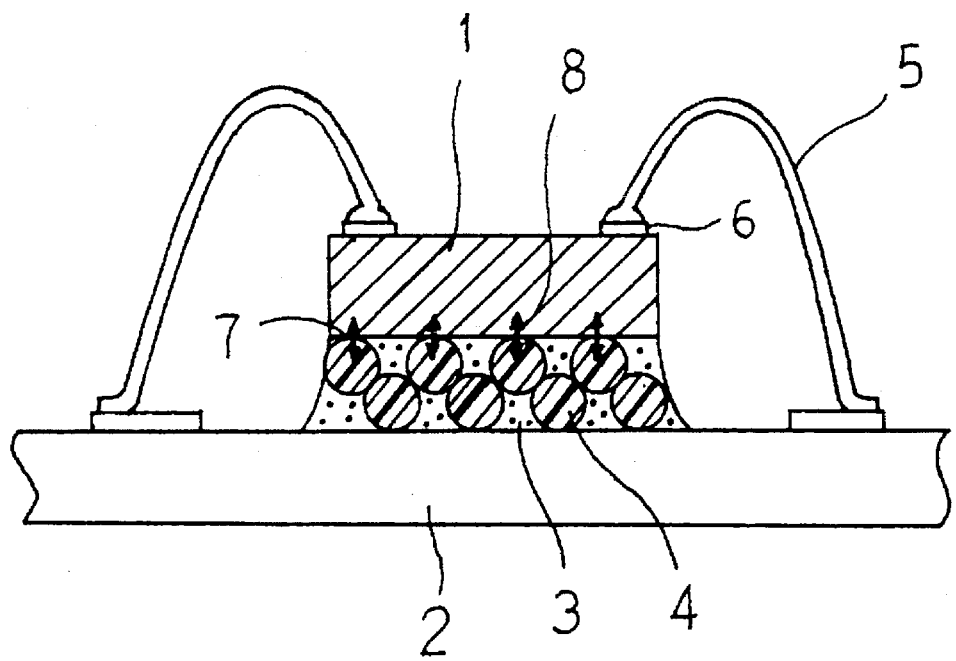

The final (i.e., post-curing) film thickness of the adhesive for semiconductors manufactured as described above must keep at least the particle size of the resin beads 4. The film thickness, however, may contain a plurality of resin beads 4 which are overlapped vertically and randomly as shown in FIG. 1B. Nevertheless, a confirmed fact is that the film thickness of the adhesive for semiconductors should be set to within a range from 5 μm to 100 μm, which will be described herein later.

On the other hand, the compounding resin beads 4 may not necessarily be required to be uniform in particle size. That is, there is no problem at all as long as the film thickness of the adhesive for semiconductors is controlled to be within a range from 5 μm to 100 μm after curing under a load applied to such an extent that the resin beads 4 will not be deformed or fractured.

In the semiconductor device composed as described above, stress 8 applied from the side of the substrate 2 caused by change in the temperature acts in the directions indicated by the up and down arrows of FIGS. 1A and 1B at the points of contact between the sensor element 1 and the resin beads 4. The stress 8 is mitigated by the resin beads 4 with an elastic modulus of 20 GPa or less on the principle described later.

Figure 2:
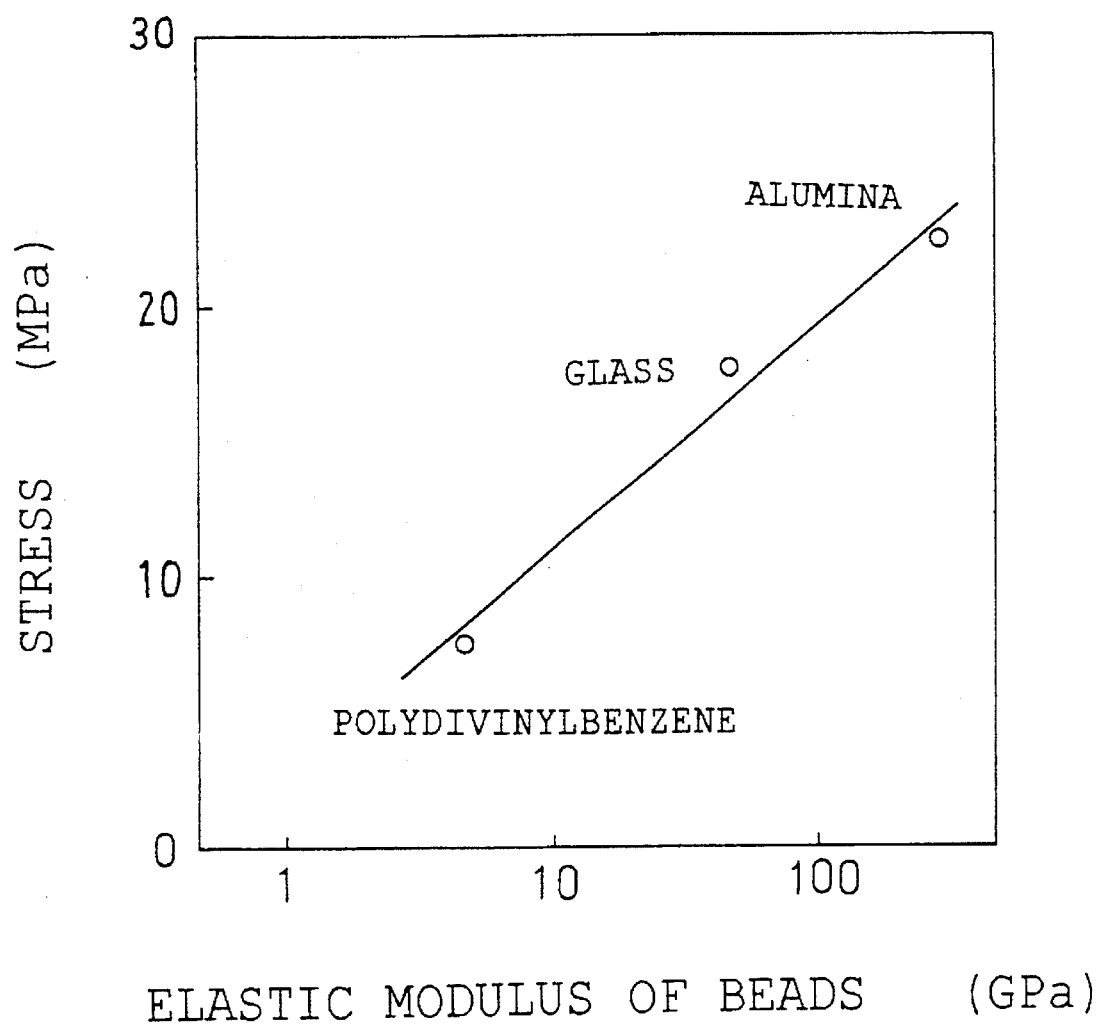
FIG. 2 is a graph illustrating the stress in relation to the elastic modulus of beads according to the present invention.

FIG. 2 illustrates the relation of the stress which acts on the sensor element 1 when three different kinds of beads made of alumina, glass and polydivinylbenzene with respective different elastic moduli are compounded respectively in equal quantities with the base adhesive 3 with an elastic modulus of 1 MPa. It is confirmed from FIG. 2 that the stress on the sensor element 1 increases in proportion to the elastic modulus of the beads.

Figure 3:
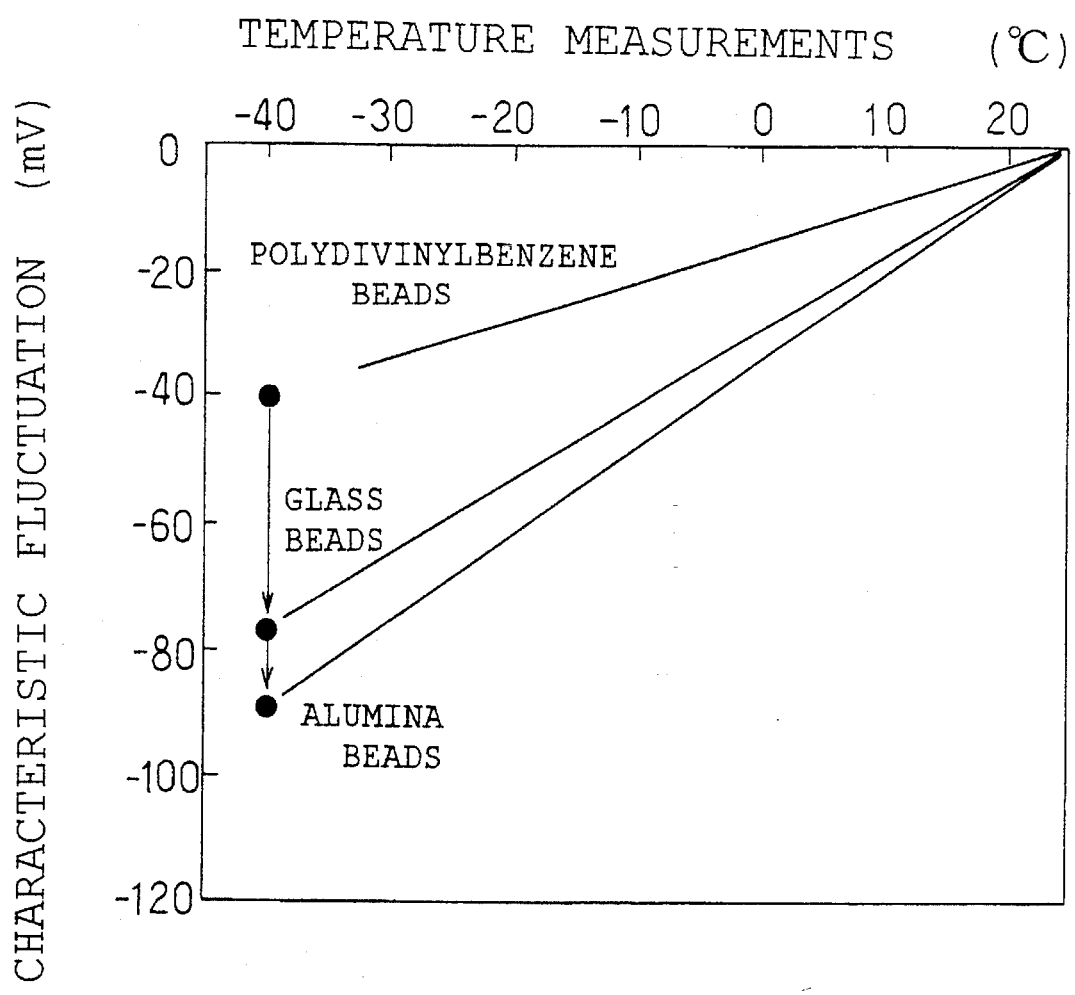
FIG. 3 is a graph illustrating the temperature dependability of the characteristic fluctuation according to the present invention.

FIG. 3 illustrates the characteristic fluctuation caused by change in the temperature, i.e., the dependability of the characteristic fluctuation on temperature, when the above three different kinds of beads with different elastic moduli are mixed respectively in equal quantities with the base adhesive 3 having an elastic modulus of 1 MPa. FIG. 3 indicates that, whatever material (alumina, glass or polydivinylbenzene) is used for the beads to be compounded with the base adhesive 3, the characteristic fluctuation varies almost linearly as temperature changes.

It is confirmed from FIGS. 2 and 3 that as the elastic modulus of the beads is greater, i.e., as the stress on the sensor element 1 is larger, the characteristic fluctuation is also larger as the temperature changes.

This relation is caused due to the transmission of stress applied from the side of the substrate 2 to the sensor element 1 as the temperature changes. That is, the beads columnarily exist between the substrate 2 and the sensor element 1. As temperature changes in this state, the stress applied from the side of the substrate 2 is mitigated by the sufficiently elastic base adhesive 3. For some beads, however, the stress can not be mitigated so easily and is converted to vertical stress 8 at the contact point 7 thereof with the sensor element 1. When the vertical stress 8 makes the sensor element 1 curved, the characteristic fluctuation of the sensor element 1 occurs. When hard silica powder or glass is used for the beads as in the above prior art, the vertical stress 8 is made larger as illustrated in FIG. 2, and the characteristic fluctuation is also made larger as illustrated in FIG. 3. As a result, the reliability for the semiconductor device is lowered.

The inventors of the present invention repeated technical trial and error based on the above results. As a result, it was found that, in order to mitigate the stress applied from the side of the substrate or lead frame 2 due to change in the temperature and to restrain the characteristic fluctuation, materials such as phenolic resin and hard epoxy resin with an elastic modulus of 20 GPa or less are suitable for the resin beads to be compounded with the base adhesive 3.

Particularly for the sensor element 1 which senses microstress, the resin beads 4 with an elastic modulus of 10 GPa or less may preferably be used. For this purpose, it is possible to use phenolic resin, hard epoxy resin, polydivinylbenzene resin, vinyl resin, silicone resin, urethane resin, acrylic resin, polyamide resin, polyimide resin or flexible epoxy resin, or the combination of any of these materials.

For the base adhesive 3, a material with an elastic modulus of 500 MPa or less may preferably be used. For this purpose, it is possible to use silicone resin, urethane resin, acrylic resin, polyamide resin, polyimide resin or flexible epoxy resin, or the combination of any of these materials.

Figure 4:
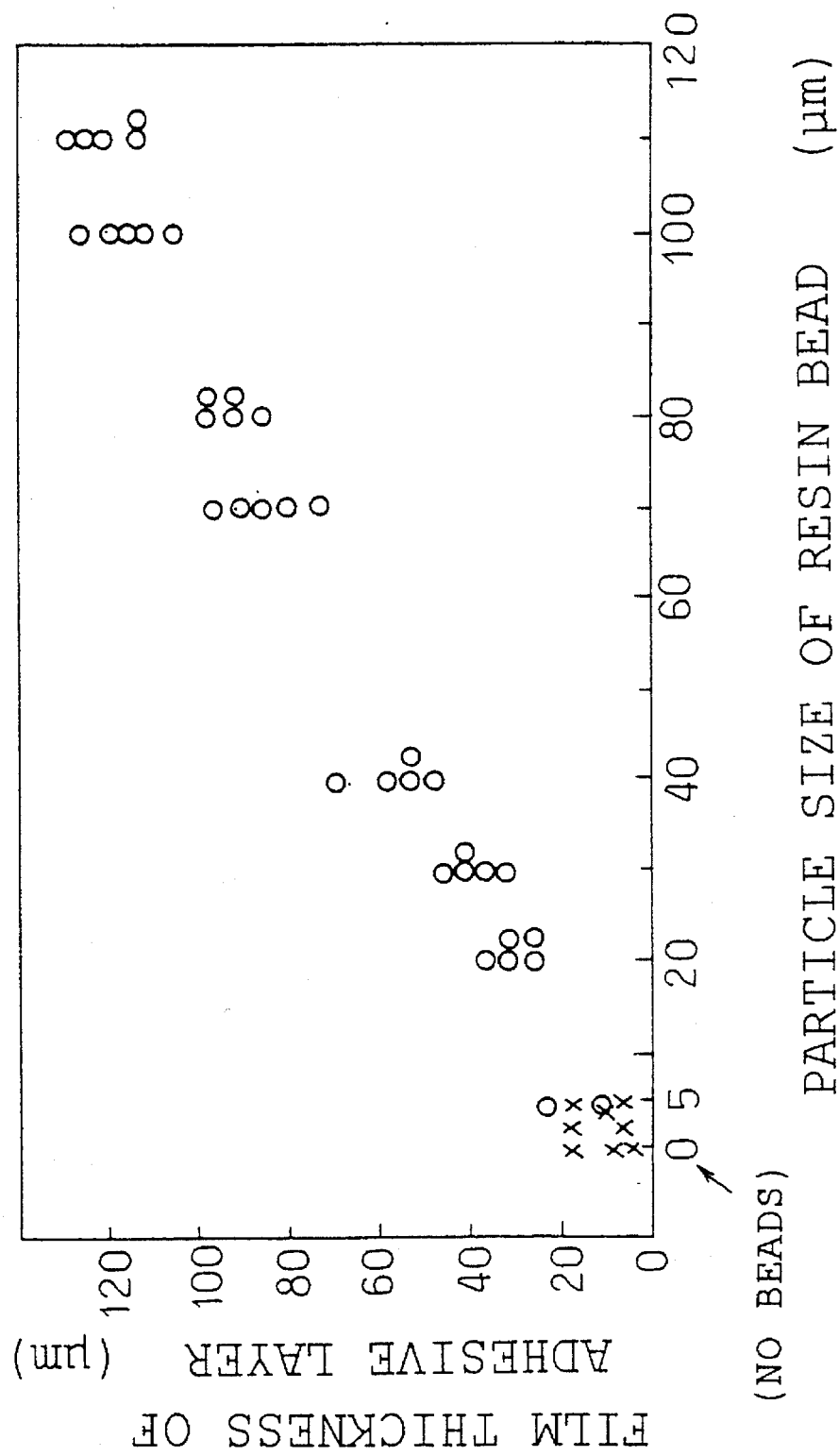
FIG. 4 is a graph illustrating the wire bondability in relation to the particle size of resin beads according to the present invention.

FIG. 4 illustrates the results of a wire bondability test according to the particle size of each resin bead 4. In this figure, the circle mark (○) denotes high wire bondability while the cross mark (×) denotes low wire bondability (i.e., no effective wire bonding). As the results show, when the resin beads 4 with a particle size of under 5 μm are used, the wire bondability is extremely low, resulting in defects in wire bonding with most wires failed to be bonded.

As a result of further technical trial and error, it was found that when the resin beads 4 were over 70 μm in particle size, the tensile bonding strength of the sensor element 1 widely varied, and when the resin beads 4 were over 100 μm in particle size, the tensile bonding strength of the sensor element 1 substantially decreased.

Accordingly, for the optimum particle size of the resin beads 4 to be compounded with the base adhesive 3, which varies according to the size or shape of the sensor element 1, a range from 5 μm to 100 μm is acceptable while 5 μm is the minimum requirement at or over which any defect will not be caused to wire bonding, and a range from 20 μm to 70 μm is preferable.

In the manufacturing process of the semiconductor device according to the present invention, the adhesive for semiconductors is cured with a load applied to the sensor element 1 to such an extent that the above resin bead 4 will not be deformed or damaged. For this reason, the particle size range of the resin beads 4 from 5 μm to 100 μm determines the film thickness range of the adhesive for semiconductors after all. In other words, defects in wire bonding can be prevented and the desired, stable tensile bonding strength of the sensor element 1 can be obtained by adjusting the particle size of the resin beads 4 to be within a range from 5 μm to 100 μm, and adjusting the film thickness of the adhesive for semiconductors to be within a range from 5 μm to 100 μm after curing with the above particle size range of the resin bead 4 maintained.

With the foregoing results taken into account, Table 1 below indicates the results of test conducted in comparisons with the prior art. Table 1 also indicates cases where silicone resin was used for the base adhesive 3 and low alkaline glass was used for the compounding beads as comparative cases.

TABLE 1

| Item | | Case | Prior art | Comparative Example | First Example | Second Example | Third Example |
|---|---|---|---|---|---|---|---|
| Base adhesive | Material | | Hard epoxy resin | Silicone resin | Silicone resin | Silicone resin | Flexible epoxy resin |
| | Elastic modulus (GPa) | | 10 | $1 \times 10^{-3}$ | $1 \times 10^{-3}$ | $1 \times 10^{-3}$ | $1 \times 10^{-3}$ |
| Compounding beads | Material | | Low alkaline glass | Low alkaline glass | Polydivinylbenzene resin | Silicone resin | Polydivinylbenzene resin |
| | Elastic modulus (GPa) | | 84 | 84 | 4.8 | 4–6 | 4.8 |
| | Particle size (μm) | | 40 | 40 | 30 | 20–30 | 30 |
| Dependability of output voltage of sensor element on temperature (Characteristic fluctuation) | | | High | Slightly high | Low | Low | Low |
| Total evaluation | | | No good | Moderate | Good | Good | Good |

As is evident from Table 1, when polydivinylbenzene resin or silicone resin with an elastic modulus range from 4 GPa to 6 GPa is used for beads to be compounded with the base adhesive 3 instead of conventional low alkaline glass with an elastic modulus as much as 84 GPa, the characteristic fluctuation of the sensor element 1 can be reduced. For the reference purpose, silicone resin or flexible epoxy resin with an elastic modulus of $1 \times 10^{-3}$ GPa can effectively be used for the base adhesive 3 instead of hard epoxy resin with an elastic modulus of 10 GPa.

Next, the compounding volume of the resin beads 4 is determined as follows:

If at least three pieces of the resin beads 4 are evenly distributed within the adhesive layer of each semiconductor device, the thickness of the adhesive film can theoretically be made uniform. Therefore, the compounding volume of the resin beads 4 equivalent to at least three pieces of the resin beads 4 may be set as the minimum volume.

If the volume content of the resin beads 4 exceeds 70%, however, the volume of the base adhesive 3 will be insufficient for the volume of the compounding resin beads 4, and the tensile bonding strength of the sensor element 1 will be lowered. Furthermore, as the number of transferred compounding resin beads widely varies, the volume content of the resin beads is suitable at 70% or less for the upper limit of the compounding volume of the resin beads 4.

It is preferable that the volume content of the resin beads 4 may be 50% or less to obtain a range in which the variation in the number of transferred resin beads can be controlled and the processability can sufficiently be secured.

In practically producing the adhesive of this embodiment, it is only needed to satisfy the following conditions:

The volume content of the resin beads 4 to be compounded with the base adhesive 3 and the number of the resin beads 4 are given by Equation (1). The compounding volume of the resin beads 4 can be limited to the range determined by Equation (2), and may preferably be limited to the range determined by Equation (3).

$$X_V = (100 X_W/\rho_b)/\{(100-X_W)/\rho_r + X_W/\rho_b\} \quad n = (X_V/100)/\{4\pi/3 \times (r/2000)^3\} \times Sr_{max}/10^3 \tag{1}$$

$$100\pi r^3 \rho_b/\{2 \times 10^8 \rho_r Sr_{max} + \pi r^3(\rho_b - \rho_r)\} < X_W < 7000\rho_b/(100\rho_r + 70\rho_b - 70\rho_r) \tag{2}$$

$$100\pi r^3 \rho_b/\{2 \times 10^8 \rho_r Sr_{max} + \pi r^3(\rho_b - \rho_r)\} < X_W < 5000\rho_b/(100\rho_r + 50\rho_b - 50\rho_r) \tag{3}$$

where, $X_V$: Volume content of the resin beads (vol. %)
$X_W$: Weight content of the resin beads (wt %)
n: Number of the resin beads to be compounded with the adhesive layer under the sensor element
r: Average particle size of the resin beads (μm)
$r_{max}$: Maximum particles size of the resin beads (μm)
$\rho_r$: Specific gravity of the base adhesive
$\rho_b$: Specific gravity of resin beads
S: Bonding area on the sensor element (mm²)

Applying die bonding directly to the sensor element 1 for sensing strain in mounting on the substrate 2 as illustrated in FIGS. 1A and 1B by using the adhesive for semiconductors with which the base adhesive 3 with the above elastic modulus and the resin beads 4 with the above elastic modulus and particle size compounded in the above state makes the structure of the semiconductor device so simple that the semiconductor device can be downsized. Furthermore, the stress can sufficiently be mitigated and the output characteristic fluctuation of the sensor element 1 can be reduced. As a result, defects in wire bonding can be prevented.

Here, for the purpose of narrowing the variation of the adhesive film thickness, the form of the resin bead 4 may preferably be spherical with a sphericality of 80% or more. When the resin bead 4 is not completely spherical, the diameter may not be limited to one measurements but the maximum diameter and the minimum diameter can be measured for a single sphere, and the sphericality referred to herein can be expressed by the following equation:

$$\text{(Minimum diameter)}/\text{(Maximum diameter)} \times 100 \tag{4}$$

As described above, according to the present invention, as flexible resin is used for the base adhesive and resin is used for the beads to be compounded with the base adhesive in the preparation of the adhesive for semiconductors to be used for fixing the sensor element for sensing strain on the substrate, excellent effects are produced. That is, the stress applied from the side of the substrate can effectively be mitigated, the characteristic fluctuation of the sensor element for sensing the strain can be reduced and that good wire bonding can be achieved in the wire bonding process.

What is claimed is:

1. A semiconductor device comprising:

a substrate;

a sensor element for sensing strain and outputting signals; and an adhesive for fixing said sensor element on said substrate, said adhesive comprising:

a base adhesive made of flexible resin with an elastic modulus of 500 MPa or less; and a compounding resin bead with an elastic modulus of 20 GPa or less, and a particle size thereof being within a range from of 5 μm to 100 μm, wherein said sensor element is fixed on said substrate such that a film thickness of said adhesive is within a range from 5 μm to 100 μm and such that the particle size of said resin bead is maintained.

2. The semiconductor device according to claim 1, wherein said resin bead is made of at least one of phenol resin, hard epoxy resin, vinyl resin, silicone resin, urethane resin, acrylic resin, polyamide resin, polyimide resin, polydivinylbenzene resin and flexible epoxy resin.

3. The semiconductor device according to claim 1, further comprising a bonding wire which is bonded to said sensor element.

4. The semiconductor device according to claim 2, further comprising a bonding wire which is bonded to said sensor element.

5. A semiconductor device according to claim 1, wherein said flexible resin has an elastic modulus of approximately 1 MPa.

6. A semiconductor device according to claim 5, wherein said flexible resin is selected from the group consisting of silicon resin and flexible epoxy resin.

7. A semiconductor device according to claim 1, wherein said resin bead has a optimum particle size within a range from 20 μm to 70 μm.

8. A semiconductor device according to claim 1, wherein a volume content of said resin beads in said adhesive is at most 70%.

9. A semiconductor device according to claim 1, wherein said resin bead is a spherical resin bead with a sphericity of 80% or more.

* * * * *